(12) United States Patent
Kiuchi et al.

(10) Patent No.: US 7,214,424 B2
(45) Date of Patent: May 8, 2007

(54) HEAT-PEELABLE PRESSURE-SENSITIVE ADHESIVE SHEET

(75) Inventors: Kazuyuki Kiuchi, Ibaraki (JP); Toshiyuki Oshima, Ibaraki (JP); Akihisa Murata, Ibaraki (JP); Yukio Arimitsu, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/123,113

(22) Filed: Apr. 17, 2002

(65) Prior Publication Data

US 2002/0192463 A1 Dec. 19, 2002

Related U.S. Application Data

(63) Continuation-in-part of application No. 09/516,148, filed on Mar. 1, 2000, now abandoned.

(30) Foreign Application Priority Data

Mar. 1, 1999 (JP) .............................. P. 11-52996

(51) Int. Cl.
*B32B 7/12* (2006.01)

(52) U.S. Cl. ............... 428/343; 428/355 R; 428/318.4; 428/319.3; 428/319.7; 428/901; 156/241; 156/326

(58) Field of Classification Search ................ 428/343, 428/345, 308.6, 317.7, 317.9, 319.3, 319.7, 428/355 R, 318.4, 901; 156/241, 326
See application file for complete search history.

(56) References Cited

U.S. PATENT DOCUMENTS

| | | | | |
|---|---|---|---|---|
| 3,931,073 A | * | 1/1976 | Jackson et al. | 428/480 |
| 4,052,483 A | * | 10/1977 | Feeney et al. | 525/316 |
| 4,740,416 A | * | 4/1988 | DeCoste et al. | 442/44 |
| 4,968,558 A | * | 11/1990 | Fisher et al. | 428/345 |
| 5,441,810 A | | 8/1995 | Aizawa et al. | |
| 5,476,712 A | * | 12/1995 | Hartman et al. | 428/317.3 |
| 5,609,954 A | | 3/1997 | Aizawa et al. | |
| 5,846,622 A | | 12/1998 | Imaeda | |
| 5,897,949 A | * | 4/1999 | Luhmann et al. | 428/317.3 |
| 6,231,962 B1 | * | 5/2001 | Bries et al. | 428/317.3 |
| 6,432,475 B1 | * | 8/2002 | Yamamoto et al. | 427/208.4 |
| 2001/0053814 A1 | * | 12/2001 | Yamamoto et al. | 524/560 |

FOREIGN PATENT DOCUMENTS

| | | |
|---|---|---|
| EP | 0 206 760 A2 | 12/1986 |
| EP | 0 612 823 A1 | 8/1994 |
| JP | 7-183195 A | 7/1995 |

OTHER PUBLICATIONS

Patent Abstracts of Japan, vol. 1995, No. 10, corresponding to JP-A-7-183195.
Patent Abstracts of Japan, vol. 012, No. 467 (C-550), corresponding to JP-A-63-186791.
Patent Abstracts of Japan, vol. 1998, No. 11, corresponding to JP-A-10-168401.
European Search Report.

* cited by examiner

*Primary Examiner*—Hai Vo
(74) *Attorney, Agent, or Firm*—Sughrue Mion, PLLC

(57) ABSTRACT

A heat-peelable adhesive sheet which shows small increase in the degree of contamination caused by a heat treatment for lowering an adhesive force is disclosed. The heat-peelable pressure sensitive adhesive sheet comprises a heat-expandable layer containing heat-expandable microspheres and expanding upon heating, and a non-heat expandable pressure-sensitive adhesive layer formed on at least one side thereof. The heat-peelable pressure-sensitive adhesive sheet can achieve the desired adhesive properties such as an excellent adhesive force before heating and also show a quick lowering of the adhesive force upon heating. Further, it shows small increase in the degree of contamination due to the treatment for lowering the adhesive force. Due to those characteristics, the heat-peelable pressure-sensitive adhesive sheet is practically applicable to, for example, the production of electronic parts made of thinner semiconductor wafers.

10 Claims, 1 Drawing Sheet

HEAT-PEELABLE PRESSURE-SENSITIVE ADHESIVE SHEET

CROSS-REFERENCE TO THE RELATED APPLICATION

This application is a continuation-in-part application of U.S. application Ser. No. 09/516,148, filed Mar. 1, 2000, entitled "HEAT-PEELABLE PRESSURE-SENSITIVE ADHESIVE SHEET", now abandoned.

FIELD OF THE INVENTION

The present invention relates to a heat-peelable pressure-sensitive adhesive sheet which can decrease its adhesive force upon heating and, therefore, can easily be peeled from an adherend without contamination, so that the sheet is suitably applicable to, for example, electronic parts. As industrial field of application, this sheet is used for processing (polishing, dicing, etc.) electronic parts such as semiconductor wafers or laminate ceramic parts.

DESCRIPTION OF THE RELATED ART

Heat-peelable pressure-sensitive adhesive sheets comprising a substrate and a pressure-sensitive adhesive layer containing a foaming agent, formed thereon have conventionally been known (see, for example, JP-B-50-13878, JP-B-51-24534, JP-A-56-61468, JP-A-56-61469 and JP-A-60-252681; the term "JP-B" as used herein means an "examined Japanese patent publication", and the term "JP-A" as used herein means an "unexamined published Japanese patent application"). The pressure-sensitive adhesive force of those heat-peelable pressure-sensitive adhesive sheets can be lowered by a heat treatment for foaming or expanding the pressure-sensitive adhesive layer, so that they can easily be peeled from an adherend. Those heat-peelable pressure-sensitive adhesive sheets have been used in, for example, tentative fixation in the production step of ceramic condensers.

However, the conventional heat-peelable pressure-sensitive adhesive sheets suffer from a problem that, when it is used in dicing or back side-polishing semiconductor wafers, the wafers have a number of extremely fine (i.e., visually invisible) contaminants remaining thereon after heating and then peeling the tapes off, which sometimes makes these wafers unusable in practice. This problem of contamination is caused by a remarkable increase in the contaminants due to the heat treatment, compared with the amount of the contaminants before heating.

For instance, when contaminants on a 4-inch silicon wafer are counted with a laser surface examination apparatus, it is generally observed that a wafer has less than 1,000 contaminants after peeling a sheet without heating, but the number of contaminants exceeds 10,000 after heating, thus showing an increase in the degree of contamination by 10 times or more.

JP-A-6-306337 describes the structure comprising a substrate, a rubbery organic elastic layer, a heat-expandable layer and an adhesive layer, but does not describe at all regarding a method in which an adhesive layer decreases organic contamination or the like. Thus, this publication does not discuss the problem of organic contamination.

SUMMARY OF THE INVENTION

Accordingly, one object of the present invention is to provide a heat-peelable pressure-sensitive adhesive sheet which shows little increase in the degree of contamination caused by a heat treatment carried out to lower the adhesive force.

As a result of extensive investigations, it has been succeeded to obtain a pressure-sensitive adhesive sheet which causes only a slight degree of contamination of an adherend, and therefore is applicable in practice to, for example, the production of electronic parts made of semiconductor wafers.

The heat-peelable pressure-sensitive adhesive sheet according to the invention comprises a substrate, a heat-expandable layer which contains heat-expandable microspheres and expands upon heating, formed on at least one side of the substrate, and a non-heat-expandable pressure-sensitive adhesive layer formed on the heat-expandable layer, wherein when the heat-peelable pressure-sensitive sheet is adhered to a semiconductor silicon wafer and then peeled from the wafer by heating, an amount of organic contamination on the surface of the semiconductor silicon wafer $\Delta c$ or C/Si is 50 or less, or 2.5 or less, respectively.

The non-heat-expandable pressure-sensitive adhesive may be a radiation-curing pressure-sensitive adhesive.

When the adhesive in the non-expandable pressure-sensitive layer comprises a polymer containing a low molecular weight component having a molecular weight of 100,000 or less in an amount of 15% by weight or less based on the weight of the polymer, or the adhesive in the radiation-curing non-expandable pressure-sensitive layer after radiation irradiation comprises a polymer containing a low molecular weight component having a molecular weight of 100,000 or less in an amount of 15% by weight or less based on the weight of the polymer, a sheet or tape for processing electronic parts, having decreased contamination property can be provided.

The present invention makes it possible to obtain a heat-peelable pressure-sensitive adhesive sheet wherein its adhesive force can quickly be lowered by heating while achieving the desired pressure-sensitive adhesive properties such as an excellent adhesive force before heating due to the heat-expandable layer using the heat-expandable microspheres and the pressure-sensitive adhesive layer formed thereon, and increase in the degree of contamination of an adherend due to the treatment for lowering its adhesive force is small. It is believed that this effect of preventing an increase in the degree of contamination is due to the covering effect of the pressure-sensitive adhesive layer on the heat-expandable layer, but considering the fact that lowering the adhesive force is also achieved, the detailed mechanism of developing such effects is unclear.

However, it is practically significant to simultaneously achieve lowering the adhesive force and preventing an increase in the degree of contamination by the structure such that the pressure-sensitive adhesive layer is formed on the heat-expandable layer. By those effects, a heat-peelable sheet which causes a low degree of contamination of an adherend after heat-peeling and is practically usable in, for example, the production of electronic parts made of semiconductor wafers can be obtained by using a contamination-preventive pressure-sensitive adhesive layer in which contamination after peeling, such as adhesive remaining, is less. As a result, the thickness of wafers, which has conventionally been restricted by the problem of breakage in peeling caused by the residual adhesive force, like contamination-preventive type radiation-curing pressure-sensitive adhesive layers, can be further reduced by using such a sheet having a lowered adhesive force.

Figure 1:
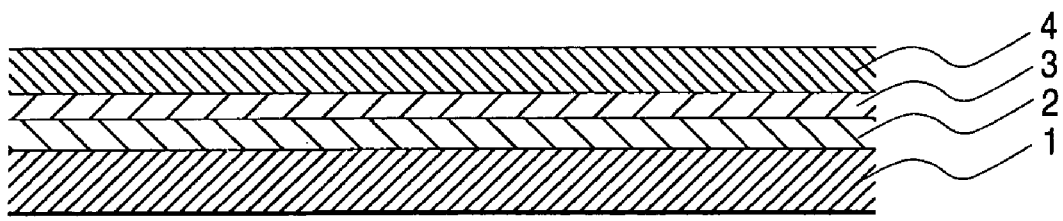
FIG. 1 is a sectional view of one embodiment of the present invention.

In the drawings, each numerical symbol has the following meaning:

1: substrate
2, 21: heat-expandable layer
3, 31: non-heat-expandable pressure-sensitive adhesive layer
4: release liner
5: rubbery organic elastic layer.
6: pressure-sensitive adhesive layer.

DETAILED DESCRIPTION OF THE INVENTION

Figure 2:
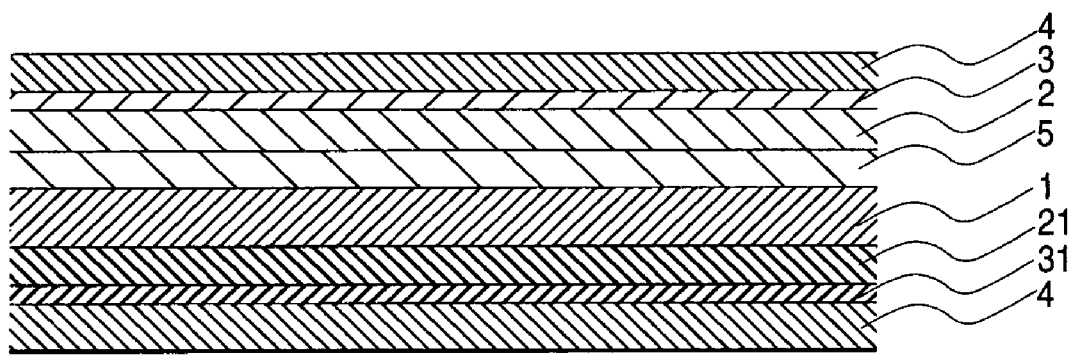
FIG. 2 is a sectional view of another embodiment of the present invention.
Figure 3:
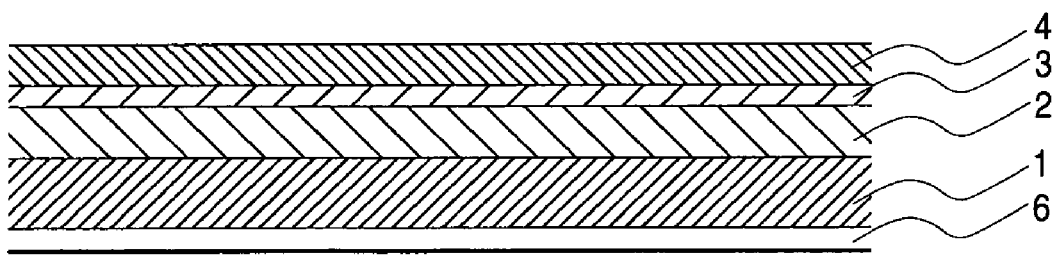
FIG. 3 is a sectional view of further embodiment of the present invention

The heat-peelable pressure-sensitive adhesive sheet according to the present invention comprises a substrate, a heat-expandable layer which contains heat-expandable microspheres and expands upon heating, formed on at least one side of the substrate, and a non-heat expandable pressure-sensitive adhesive layer formed on the non-heat-expandable layer. FIGS. 1 and 2 show examples thereof. In these figures, 1 is a substrate, 2 and 21 each represent a heat-expandable layer; 3 and 31 each represent a non-heat-expandable pressure-sensitive adhesive layer; and 4 and 5 represent a release liner and a rubber-like organic elastic layer, respectively, that may be provided if desired and necessary.

Heat-Expandable Layer

The heat-expandable layer contains heat-expandable microspheres and expands upon heating. By the uneven deformation caused by the expansion, the pressure-sensitive adhesive layer provided on the surface of the heat-expandable layer also undergoes uneven deformation and thus the adhesive force thereof to an adherend is lowered. Therefore, the heat-peelable pressure-sensitive adhesive sheet adhered to the adherend can easily be peeled from the adherend by heating the heat-expandable layer whenever needed.

The heat-expandable layer can be formed by, for example, mixing the heat-expandable microspheres with a binder. Appropriate materials such as polymers or waxes allowing the foaming and/or expansion of the heat-expandable microspheres upon heating can be used as the binder. In particular, it is preferable to use materials not restricting the foaming and/or expansion of the heat-expandable microspheres as less as possible. Considering heat-expandability of the heat-expandable microspheres and controllability of pressure-sensitive adhesive properties (for example, the adhesive force to an adherend through the pressure-sensitive adhesive layer), pressure-sensitive adhesives are particularly preferably used as the binder.

The pressure-sensitive adhesive used in the heat-expandable layer is not particularly limited. Examples of the pressure-sensitive adhesive that can be used include pressure-sensitive adhesives using polymers such as rubber polymers, acrylic polymers, vinylalkyl ether polymers, silicone polymers, polyesters, polyamides, urethane polymers, fluoropolymers or styrene/butadiene copolymers, pressure-sensitive adhesives containing holt melt resins having a melting point of, for example 200° C. or lower to improve creep properties, radiation-curing pressure-sensitive adhesives, and pressure-sensitive adhesives optionally containing various additives such as crosslinking agents, tackifiers, plasticizers, softeners, fillers, pigments, coloring matters, antioxidants and surfactants (see, for example, JP-A-56-61468, JP-A-61-174857, JP-A-63-17981 and JP-A-56-13040). Those can be used alone or as mixtures of two or more thereof.

From the point of the balance between the controllability of the adhesive force of the heat-peelable pressure-sensitive adhesive sheet to an adherend through the non-heat-expandable pressure-sensitive adhesive layer before heating and lowering of the adhesive force upon heating, pressure-sensitive adhesives using, as a base polymer, a polymer having a dynamic modulus of elasticity of 50,000 to 10,000,000 dyn/cm$^2$ in a temperature region of from ordinary temperature to 150° C. are preferable, but the pressure-sensitive adhesives used in the present invention are not particularly limited to those.

Examples of the pressure-sensitive adhesive generally used include rubber pressure-sensitive adhesives using, as a base polymer, natural rubbers or rubber-type polymers (for example, polyisoprene rubber, styrene/butadiene rubber, styrene/isoprene/styrene block copolymer, styrene/butadiene/styrene block copolymer, reclaimed rubber, butyl rubber, polyisoprene rubber or NBR); and acrylic pressure-sensitive adhesives using, as a base polymer, acrylic polymers comprising alkyl acrylates or alkyl methacrylates.

Examples of the acrylic polymers include acrylates or methacrylates having straight-chain or branched alkyl groups having 1 to 20, preferably 4 to 18, carbon atoms, such as methyl group, ethyl group, propyl group, butyl group, amyl group, hexyl group, heptyl group, 2-ethylhexyl group, isooctyl group, isononyl group, isodecyl group, dodecyl group, lauryl group, tridecyl group, tetradecyl group, pentadecyl group, hexadecyl group, heptadecyl group, octadecyl group, nonadecyl group or eicosyl group. Those polymers may be used alone or as mixtures of two or more thereof.

The acrylic polymers may be those obtained by copolymerizing one or more appropriate monomers so as to improve, for example, cohesive force, heat stability or crosslinking properties. Copolymerizable monomers used together are not particularly limited so long as it can copolymerize with the alkyl (meth)acrylates.

Examples of the copolymerizable monomers include carboxyl group-containing monomers such as acrylic acid, methacrylic acid, carboxyethyl acrylate, carboxypentyl acrylate, itaconic acid, maleic acid, fumaric acid or crotonic acid; acid anhydride monomers such as maleic anhydride or itaconic anhydride; and hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate or (4-hydroxymethylcyclohexyl) methyl(meth)acrylate.

Further examples of the copolymerizable monomers include sulfonate group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate or (meth)acryloyloxynaphthalenesulfonic acid; phosphate group-containing monomers such as 2-hydroxyethylacryloyl phosphate; (N-substituted) amide monomers such as (meth) acrylamide, N,N-dimethyl (meth)acrylamide, N-butyl (meth)acrylamide, N-methylol (meth)acrylamide or N-methylolpropane (meth)acrylamide; alkylamino (meth)acrylate monomers such as aminoethyl (meth)acrylate, N,N-dimethylaminoethyl (meth)acrylate or t-butylaminoethyl (meth) acrylate; alkoxyalkyl (meth)acrylate monomers such as methoxyethyl (meth)acrylate or ethoxyethyl (meth)acrylate; maleimide monomers such as N-cyclohexyl maleimide, N-isopropyl maleimide, N-lauryl maleimide or N-phenyl maleimide; itaconimide monomers such as N-methyl itaconimide, N-ethyl itaconimide, N-butyl itaconimide, N-octyl itaconimide, N-2-ethylhexyl itaconimide, N-cyclohexyl itaconimide or N-lauroyl itaconimide; and succinimide monomers such as N-(meth)acryloyloxymethylene succinimide, N-(meth)acryloyl-6-oxyhexamethylene succinimide or N-(meth)acryloyloxy-8-oxyoctamethylene succinimide.

Further examples of the copolymerizable monomers include vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrrole, vinylimidazole, vinyloxazole, vinylmorpholine, N-vinyl carbonamide, styrene, α-methylstyrene or N-vinylcaprolactam; cyanoacrylate monomers such as acrylonitrile or methacrylonitrile; epoxy group-containing acrylic monomers such as glycidyl (meth)acrylate; glycol acrylate monomers such as polyethylene glycol (meth)acrylate, polypropylene glycol (meth)acrylate, methoxyethylene glycol (meth)acrylate or methoxypropylene glycol (meth) acrylate; acrylate monomers such as tetrahydrofurfuryl (meth)acrylate, fluorine (meth)acrylate, silicone (meth)acrylate or 2-methoxyethyl acrylate; polyfunctional monomers such as hexanediol di(meth)acrylate, polyethylene glycol di(meth)acrylate, (poly)propylene glycol di(meth)acrylate, neopentylglycol di(meth)acrylate, pentaerythritol di(meth) acrylate, trimethylolpropane tri(meth)acrylate, pentaerythritol tri(meth)acrylate, dipentaerythritol hexa(meth)acrylate, epoxy acrylate, polyester acrylate, urethane acrylate, divinylbenzene, butyl diacrylate or hexyl diacrylate; isoprenes; butadienes; isobutylenes; and vinyl ethers.

Examples of the heat-expandable microspheres used in the heat-expandable layer include microcapsules obtained by encapsulating an appropriate substance which can be easily gasified and shows heat-expandability (for example, isobutane, propane or heptane) in a shell made of a shell-forming material such as a hot-melt material or a material which can be broken upon heat expansion (for example, vinylidene chloride/acrylonitrile copolymer, polyvinyl alcohol, polyvinyl butyral, polymethyl methacrylate, polyacrylonitrile, polyvinylidene chloride or polysulfone) by an appropriate method such as coacervation or interfacial polymerization.

Use of the heat-expandable microspheres can stably prevent an increase in the degree of contamination of an adherend due to heating. In a foaming agent that is not microencapsulated, for example, effect of preventing an increase in the degree of contamination becomes poor because of probably the cohesive failure of the pressure-sensitive adhesive layer forming the surface. From the standpoint of, for example, the handling properties to lower the adhesive force by heating (in particular, the achievement of the stable lowering of the adhesive force), heat-expandable microspheres showing a volume expansion ratio up to rupture of 5 or more, preferably 7 or more and more preferably 10 or more are preferably used.

The average particle size of the heat-expandable microspheres used can appropriately be determined. In general, heat-expandable microspheres having an average particle size of 100 µm or less, preferably 80 µm or less and more preferably from 1 to 50 µm, are used, but the present invention is not limited thereto. There are commercially available heat-expandable microspheres, for example, MICROSPHERE™ (manufactured by Matsumoto Yushi Seiyaku).

The amount of the heat-expandable microspheres used may appropriately be determined by, for example, the expansion ratio of the heat-expandable layer and the degree of lowering of the adhesive force. In general, in the case of the above-described binders and pressure-sensitive adhesives, the heat-expandable microspheres are used in an amount of from 1 to 150 parts by weight, preferably form 10 to 130 parts by weight and more preferably form 25 to 100 parts by weight, per 100 parts by weight of the base polymer.

The heat-expandable layer can be formed by, for example, mixing the heat-expandable microspheres with other components such as a binder together with, if desired and necessary, a solvent, and spreading the resulting mixture in an appropriate manner such as coating to form a sheet-like layer. The thickness of the layer can appropriately be determined depending on, for example, the degree of lowering of the adhesive force.

If the thickness of the layer is too small, the uneven deformation of the surface caused by the heat-expandable microspheres brings about the uneven deformation of the pressure-sensitive adhesive layer formed thereon, thereby failing to achieve a sufficient adhesive force. Further, the pressure-sensitive adhesive layer formed on the heat-expandable layer undergoes cohesive failure upon heating and, as a result, the degree of contamination of the adherend increases. Furthermore, if the layer thickness is too large, the adhesive force lowers insufficiently because of the insufficient deformation upon heating. To prevent the above disadvantages, the thickness of the heat-expandable layer is 300 µm or less, preferably from 2 to 200 µm and more preferably from 5 to 150 µm.

In forming the heat-expandable layer, the heat-expandable layer 2 is supported by a substrate 1 as shown in the drawings. This embodiment has some advantages such that the heat-expandable layer and also the non-heat-expandable pressure-sensitive adhesive layer are supported and reinforced by the substrate, so that the handling properties of the heat-peelable pressure-sensitive adhesive sheet are improved and the heat-peelable pressure-sensitive adhesive sheet can efficiently be adhered to an adherend and, then peeled therefrom after heating.

Substrate

The substrate is not particularly limited, but examples of the substrate that can be used are appropriate thin materials capable of supporting the heat-expandable layer. Examples of the substrate that can be used include papers, fabrics, porous materials such as non-woven fabrics or nets, plastic films (polyethylene, polypropylene, ethylene vinyl acetate, polyethylene terephthalate, polyvinyl chloride, α-olefin, polyphenylene sulfide, nylon, aramide, polyethylene ether ketone, etc.), rubber sheets, foamed sheets, metal foils and laminates thereof. Of those, thin materials having excellent heat resistance that do not melt at the heat treatment of the heat-expandable layer are preferable from the standpoints of, for example, handling properties.

The substrate may be a material that has been treated by, for example, stretching so as to control the deformation properties such as elongation. Where the pressure-sensitive adhesive layer is treated by, for example, radiation, a substrate that permeates its treating radiation is used. The thickness of the substrate can appropriately be determined depending on, for example, its strength and flexibility and the purpose of the use. The thickness is generally 500 μm or less, preferably from 3 to 300 μm and more preferably form 5 to 250 μm, but it is not limited thereto.

The sheet of the above-described substrate-supporting embodiment can be formed by an appropriate method, for example, a method of conducting the above-described spreading procedure on the substrate to directly form the heat-expandable layer on the substrate, or a method of forming the heat-expandable layer on a release liner according to the above procedure and then transferring this heat-expandable layer on the substrate.

Examples of the release line include substrate in which the above-described substrate is surface-treated with an appropriate release agent such as silicone types, long-chain alkyl types, fluorine types or molybdenum sulfide, low adhesive substrates comprising a fluoropolymer such as polytetrafluoroethylene, polychlorotrifluoroethylene, polyvinyl fluoride, polyvinylidene fluoride, tetrafluoroethylene/hexafluoropropylene copolymer or chlorotrifluoroethylene/vinylidene fluoride copolymer, and low adhesive substrates comprising a non-polar polymer such as polyethylene or polypropylene. The release liner can also be used as the substrate supporting the heat-expandable layer.

As shown in the drawings, the heat-expandable layer can be provided on one or both sides of the substrate, and the substrate can also be embedded in the heat-expandable layer. A substrate having excellent adhesion to the heat-expandable layer can be obtained by, for example, using a film comprising a highly polar polymer such as polyester, or by subjecting the substrate to an appropriate treatment such as surface oxidation by a chemical or physical procedure such as a chromic acid-treatment, exposure to ozone, exposure to flame, exposure to high-voltage electric shock or ionizing radiation.

Adhesiveness of the substrate to the heat-expandable layer is effectively improved by form an undercoating layer on the substrate. In the embodiment that the heat-expandable layer is supported by the substrate, one or more intermediate layers can be formed between the substrate and the heat-expandable layer. The intermediate layer may have an appropriate purpose of, for example, a coat layer made of a release agent for imparting peelability as described above or an undercoating layer for improving the adhesiveness as described above.

In addition to the peelable coat layer and the undercoating layer as described above, examples of the intermediate layer include layers aiming at imparting good deformation properties, layers aiming at enlarging the adhesion area to an adherend, layers aiming at improving the adhesive force, layers aiming at establishing good follow-up property to a surface shape of an adherent, layers aiming at facilitating the lowering of the adhesive force upon heating, and layers aiming at improving the peelability from an adherend after heating.

To impart deforming properties and improve the peelability after heating, it is effective to provide a rubbery organic elastic layer 5 as an intermediate layer as shown in FIG. 2. This rubbery organic elastic layer has a function to follow-up the pressure-sensitive adhesive layer on the surface to the surface shape of the adherend to thereby provide a large adhesion area when the heat-peelable pressure-sensitive adhesive sheet is adhered to the adherend; a function of increasing controllability of expansion of the heat-expandable layer upon heating; and a function to predominantly expand the heat-expandable layer in the thickness direction rather than in the plane direction to thereby form an expanded layer having excellent uniformity in thickness.

Taking above functions into consideration, the rubbery organic elastic layer is preferably formed using a natural rubber or a synthetic rubber, having rubber elasticity which has a D-scale Shore hardness (determined in accordance with ASTM D-2240 D-scale Shore) of 50 or less, preferably 45 or less and more preferable 40 or less; or a synthetic resin having a rubber elasticity. From the standpoints of the functions as described above, the rubbery organic elastic layer has a thickness of generally 500 μm or less, preferably from 3 to 300 μm and more preferably from 5 to 150 μm, but the thickness is not limited thereto.

Examples of the synthetic rubber or synthetic resin include nitrile-based, diene-based or acrylic synthetic rubbers, polyolefin-based or polyester-based thermoplastic elastomers, and synthetic resins having rubber elasticity ethylene/vinyl acetate copolymer, polyurethane, polybutadiene or flexible polyvinyl chloride. Even in substantially a hard polymer such as polyvinyl chloride, if it is blended with additives such as a plasticizer or a softener to impart rubber elasticity, such can be used in the present invention.

The rubbery organic elastic layer may be made of a pressure-sensitive adhesive substance comprising above-described forming materials as the main component. Alternatively, it may be made of, for example, a foamed film mainly comprising such components. The rubbery organic elastic layer can be formed by an appropriate method, for example, a method of applying a solution of the forming material to a substrate or a method of adhering a film made of the forming material to the substrate. From the standpoints of the above-described functions, it is preferable to overlay the rubbery organic elastic layer on the side of the heat-expandable layer opposite the side on which the pressure-sensitive adhesive layer is formed, thereby forming a laminate form. Where the pressure-sensitive adhesive layer is treated with, for example, ultraviolet light, the intermediate layer used is a layer that permeates the treating light.

Non-Heat-Expandable Pressure-Sensitive Adhesive Layer

The non-heat-expandable pressure-sensitive adhesive layer is formed on the heat-expandable layer in order to protect an adherend from an increase in the contaminants (in particular, fine contaminants) in adhering to the adherend and lowering the adhesive force by heating.

Contamination level is that when the heat-peelable pressure-sensitive sheet is adhered to a semiconductor silicon wafer and then peeled from the wafer by heating, amount of organic contamination on the surface of the semiconductor silicon wafer Δc is 50 or less, preferably 10 or less and more preferably 5 or less, or the amount of organic contamination on the surface of the semiconductor silicon wafer C/Si is 2.5 or less, preferably 1.0 or less and more preferably 0.5 or less.

The adhesive in the non-expandable pressure-sensitive layer comprises a polymer containing a low molecular weight component having a molecular weight of 100,000 or less in an amount of 15% by weight or less, preferably 10% by weight or less, more preferably 5% by weight or less, based on the weight of the polymer, and the adhesive in the radiation-curing non-expandable pressure-sensitive layer after radiation irradiation comprises a polymer containing a low molecular weight component having a molecular weight of 100,000 or less in an amount of 15% by weight or less, preferably 10% by weight or less, more preferably 5% by weight or less, based on the weight of the polymer.

The following methods are considered as a method of decreasing content of low molecular weight component in the pressure-sensitive adhesive layer of the non-heat-expandable pressure-sensitive adhesive layer, but the present invention is not particularly limited thereto.

1. An acrylic polymer obtained by, for example, polymerization is introduced in a non-solvent such as heptane (aliphatic hydrocarbon) and stirred. As a result, low molecular weight component in the polymer is dissolved in heptane, and high molecular weight component in the polymer precipitates.

2. In general polymerization, molecular weight distribution is large and low molecular weight component is formed during the polymerization. However, by conducting living radical polymerization or anion polymerization, a polymer having small molecular weight distribution is obtained. As a result, a polymer having small low molecular weight component content is obtained.

3. In general polymerization, a polymer having large molecular weight is obtained at an initial stage, and a polymer having small molecular weight is polymerized at the latter stage. Therefore, when a polymer having a conversion of 80.5 to 97% is used as a polymer for pressure-sensitive adhesive, a pressure-sensitive adhesive having small low molecular weight component content is obtained. Residual monomers may be removed by the above heptane or the like, or may be evaporated by applying high heat in drying.

The non-heat-expandable pressure-sensitive adhesive layer can be formed using an appropriate pressure-sensitive adhesive depending on the aimed pressure-sensitive adhesive properties (for example, the adhesive force to the adherend), and the kind of the pressure-sensitive adhesive used is not particularly limited. As a result, the above-described pressure-sensitive adhesives as listed above with respect to the heat-expandable layer and also conventional pressure-sensitive adhesives can be used. Pressure-sensitive adhesives that do not restrict the deformation of the heat-expandable layer upon heating are preferable.

Examples of the pressure-sensitive adhesive preferably used include those containing appropriate crosslinking agents, for example, polyfunctional crosslinking agents such as tolylene diisocyanate, trimethylolpropane tolylene diisocyanate or diphenylmethane triisocyanate; epoxy crosslinking agents such as polyethylene glycol diglycidyl ether, diglycidyl ether or trimethylolpropane triglycidyl ether; melamine crosslinking agents such as alkyl ether melamine compounds; metal salt crosslinking agents; metal chelate crosslinking agents; amino crosslinking agents; peroxide crosslinking agents; and coupling crosslinking agents such as silane coupling agents.

The above pressure-sensitive adhesives are radiation-curing pressure-sensitive adhesives, and those are such that photopolymerization initiators are blended with pressure-sensitive adhesives comprising polymers obtained by copolymerizing monomers having crosslinkable functional groups (for example, polyfunctional monomers) or pressure-sensitive adhesives containing crosslinkable low-molecular weight compounds (for example, polyfunctional monomers) so that crosslinking and curing can be conducted upon radiation irradiation. Thus, contaminants to an adherend can be reduced by the crosslinking and curing and, at the same time, the adhesive force can be lowered, if necessary.

Examples of the radiation-curing pressure-sensitive adhesives used may be appropriate radiation-curing types containing, as the photopolymerization initiator, 4-(2-hydroxyethoxy)phenyl(2-hydroxy-2-propyl)ketone, acetophenone initiators such as α-hydroxy-α,α'-dimethylacetophenone, methoxyacetophenone, 2,2-dimethoxy-2-phenylacetophenone, 2,2- diethoxyacetophenone, 1-hydroxycyclohexyl phenyl ketone or 2-methyl-1-[4-(methylthio)-phenyl]-2-morpholinopropane-1, benzoin ether initiators such as benzoin ethyl ether, benzoin propyl ether or anisoin methyl ether, α-ketol compounds such as 2-methyl-2-hydroxypropiophenone, ketal compounds such as benzyl dimethyl ketal, aromatic sulfonyl chloride compounds such as 2-naphthalenesulfonyl chloride, optically active oxime compounds such as 1-phenone-1,1-propanedione-2-(o-ethoxycarbonyl) oxime, benzophenone compounds such as benzophenone, benzoylbenzoic acid or 3,3-dimethyl-4-methoxybenzophenone, thioxanthone compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone or 2,4-diisopropylthioxanthone, camphor quinone, halogenated ketones, acyl phosphinoxide and acyl phosphonate.

The pressure-sensitive adhesive used in forming the non-heat-expandable pressure-sensitive adhesive layer may contain appropriate additives such as a plasticizer, a filler, a surfactant, an antioxidant or a tackifier as described above. However, pressure-sensitive adhesives having an additive-free composition can also be used in the use that the transfer of these additives to an adherend arises a problem, for example, the case that a low degree of contamination is desired as described above.

The non-heat-expandable pressure-sensitive adhesive layer can be formed by an appropriate method, for example, a method of applying a liquid pressure-sensitive adhesive on the heat-expandable layer or a method of forming the pressure-sensitive adhesive layer on a release liner and then transferring it to the heat-expandable layer. The thickness of the non-heat-expandable pressure-sensitive adhesive layer can appropriately be determined depending on, for example, the purpose of the utilization of the heat-peelable pressure-sensitive adhesive sheet and the desired extent of lowering the adhesive force upon heating.

In general, if the non-heat-expandable pressure-sensitive adhesive layer is too thin, cohesive failure tends to occur due to insufficient adhesive force or at the time of the uneven deformation of the heat-expandable layer, and if the non-heat-expandable pressure-sensitive adhesive layer is too thick, it becomes difficult to follow-up the uneven deformation of the heat-expandable layer upon heating. Therefore, the thickness of the non-heat-expandable pressure-sensitive adhesive layer is 20 μm or less, preferably from 0.1 to 10 μm and more preferably from 1 to 5 μm, from the standpoints of preventing the cohesive failure at the time heat deformation, preventing an increase in the degree of contamination of the adherend, ensuring the follow-up property of uneven deformation to the heat-expandable layer and lowering or losing the adhesive force to the adherend.

As described above, the heat-peelable pressure-sensitive adhesive sheet according to the invention can be formed into an appropriate form. In such a case, the heat-expandable layer and the non-heat-expandable pressure-sensitive adhesive layer may be formed on one side of the substrate in this order and a usual pressure-sensitive adhesive layer may be formed on the other side of the substrate. Further, since the heat-expandable layer is supported by the substrate, a separation type can be formed such that the substrate is easily peeled off from the rubbery organic elastic layer or the heat-expandable layer or a fixation type can be formed such that the substrate is strongly adhered to the rubber-like organic elastic layer or the heat-expandable layer.

The heat-peelable pressure-sensitive adhesive sheet of the separation type as described above can be formed using a release liner or a low adhesive substrate as described before. Further, the heat-peelable pressure-sensitive adhesive sheet of the fixation type can be formed using a high adhesive substrate or a surface-oxidized substrate as described above. It is preferable that the pressure-sensitive adhesive layer is protected from lowering the adhesive force due to contamination until practical use by temporarily adhering the release linerr 4 or the like thereon, as shown in FIG. 1.

The heat-peelable pressure-sensitive adhesive sheet according to the invention can be molded into appropriate forms such as sheets, tapes or labels and used in various uses, for example, adhering to adherents, similar to the conventional pressure-sensitive adhesive sheets. The sheet can easily be separated from an adherend by lowering its adhesive force by heating whenever needed. By taking advantage of this characteristic, the heat-peelable pressure-sensitive adhesive sheet is preferably used in the case that the heat-peelable adhesive sheet is adhered to an adherend for a definite period of time and then separated therefrom. The adherend is not particularly limited and may be made of arbitrary materials such as metals, ceramics, plastics, wood or paper. The adhesion face may have an arbitrary shape such as a plane face, a curved face or a fibrous face.

Examples of the uses include formation of adhered composite articles for the purpose of recycling, of, for example, articles comprising polymers and articles comprising meals, fibers or papers; carrier tapes, tentatively fixing members or fixing members for, for example, transporting or tentatively fixing parts in the assembling step of various electric or electronic devices or display devices; and surface-protective materials or masking materials for protecting metal plates, plastic plates or glass plates from contamination and breakage.

In particular, the present invention can appropriately determine the pressure-sensitive adhesive properties such as the adhesive force through the non-heat-expandable pressure-sensitive adhesive layer depending on the purpose of the use. Further, due to that increase in contaminants, in particular, micro-contaminants, due to a lowering treatment of the adhesive force by heating is small, the heat-peelable pressure-sensitive adhesive sheet of the present invention is preferably used in uses that it can be adhered to an adherend with a high adhesive force in working, and contamination of the adherend after removing the adhered state as in, for example, back side-polishing treatment or dicing treatment of semiconductor wafers, is desired to be small.

The heat treatment for lowering the adhesive force of the heat-peelable pressure-sensitive adhesive sheet can be performed by an appropriate heating means, for example, a hot plate, a hot air dryer or a near infrared lamp. The heat treatment conditions can appropriately be determined depending on various conditions such as reduction of the adhesion area due to the surface conditions of the adherend or the type of the heat-expandable microspheres, the heat resistance and heat capacity of the substrate and the adherend, and the heating means.

In general, the heat treatment is carried out at 100 to 250° C. for 5 to 90 seconds (in case of using, for example, a hot plate) or 1 to 15 minutes (in the case of using, for example, a hot air dryer), but the present invention is not limited thereto. By the heat treatment under these conditions, the heat-expandable microspheres are usually expanded and/or foamed and thus the heat-expandable layer undergoes uneven deformation. As a result, the non-heat-expandable pressure-sensitive adhesive layer also undergoes uneven deformation and the adhesive force is lowered or lost thereby.

The present invention is described in more detail by reference to the following Examples, but it should be understood that the invention is not construed as being limited thereto. Unless otherwise indicated, all parts, percents, ratios or the like are by weight.

EXAMPLE 1

50 Parts of n-butyl acrylate, 50 parts of 2-ethylhexyl acrylate, 5 parts of acrylic acid, 0.1 part of 2,2'-azoisobutyronitrile and 200 parts of ethyl acetate were blended so as to obtain 200 g of a mixture thereof. The resulting mixture was introduced in a 500 ml three-necked flask-type reactor equipped with a thermometer, stirrer, a nitrogen inlet pipe and a reflux cooling pipe, and stirred for about 1 hour while introducing nitrogen gas thereinto, thereby replacing air inside the reactor with nitrogen. The inner temperature was elevated to 58° C., and polymerization was conducted for about 4 hours while maintaining this state, thereby obtaining acrylic copolymer A.

35 Parts of heat-expandable microspheres (MICROSPHERE F-50D) were blended with an acrylic pressure-sensitive adhesive prepared by blending 2 parts of an isocyanate crosslinking agent with an ethyl acetate solution containing 100 parts of the acrylic copolymer A (in terms of solid content) obtained above. The resulting mixture was applied on one side of a polyethylene terephthalate (PET) film having a thickness of 50 μm and dried to form a heat-expandable layer having a thickness of 40 μm. A contamination-preventive pressure-sensitive adhesive layer having a thickness of 3 μm was then formed on the heat-expandable layer to obtain a heat-peelable pressure-sensitive adhesive sheet.

The contamination-preventive pressure-sensitive adhesive layer was formed and used as follows.

50 Parts of n-butyl acrylate, 50 parts of ethyl acrylate, 5 parts of acrylic acid, 0.1 part of 2,2'-azoisobutyronitrile and 200 parts of ethyl acetate were blended so as to obtain 200 g of a mixture thereof. The resulting mixture was introduced in a 500 ml three-necked flask-type reactor equipped with a thermometer, stirrer, a nitrogen inlet pipe and a reflux cooling pipe, and stirred for about 1 hour while introducing nitrogen gas thereinto, thereby replacing air inside the reactor with nitrogen. The inner temperature was elevated to 57° C., and polymerization was conducted for about 5 hours while maintaining this state, thereby obtaining acrylic copolymer B.

An acrylic pressure-sensitive adhesive was prepared by blending 3 parts of an epoxy crosslinking agent with an ethyl acetate solution containing 100 parts of the acrylic copolymer B (in terms of a solid content) obtained above. The acrylic pressure-sensitive adhesive was applied to a release liner followed by drying, thereby forming a contamination-preventive pressure-sensitive adhesive layer. This layer on the release liner was transferred on the heat-expandable layer.

EXAMPLE 2

The same type of the heat-expandable layer as used in Example 1 was formed on one side of a PET film having a thickness of 50 μm. A contamination-preventive and radiation-curing pressure-sensitive adhesive layer having a thickness of 2 μm was formed on the heat-expandable layer to obtain a heat-peelable pressure-sensitive adhesive sheet.

The contamination-preventive and radiation-curing pressure-sensitive adhesive layer was formed and used as follows.

100 Parts of urethane acrylate, 3 parts of an isocyanate crosslinking agent and 3 parts of a photopolymerization initiator were blended with 100 parts of the acrylic copolymer B (in terms of a solid content) to obtain an acrylic pressure-sensitive adhesive. The acrylic pressure-sensitive adhesive was applied to a release liner, followed by drying, thereby forming a contamination-preventive radiation-curing and pressure-sensitive adhesive layer. This layer on the release liner was transferred on the heat-expandable layer.

EXAMPLE 3

The same type of the heat-expandable layer having a thickness of 40 μm as used in Example 1 was formed on one side of a PET film having a thickness of 50 μm. A contamination-preventive pressure-sensitive adhesive layer having a thickness of 3 μm was formed on the heat-expandable layer. The adhesive layer thus formed was covered with a release-treated PET film having a thickness of 50 μm to obtain a heat-peelable pressure-sensitive adhesive sheet.

The contamination-preventive pressure-sensitive adhesive layer was formed and used as follows.

80 Parts of 2-ethylhexyl acrylate, 20 parts of acryloyl morpholine, 3 parts of acrylic acid, 0.1 part of 2,2'-azoisobutyronitrile and 200 parts of ethyl acetate were blended so as to obtain 200 g of a mixture thereof. The resulting mixture was introduced in a 500 ml three-necked flask-type reactor equipped with a thermometer, stirrer, a nitrogen inlet pipe and a reflux cooling pipe, and stirred for about 1 hour while introducing nitrogen gas thereinto, thereby replacing air inside the reactor with nitrogen. The inner temperature was elevated to 58° C., and polymerization was conducted for about 7 hours while maintaining this state to obtain a copolymer. This copolymer was introduced in 1 liter heptane and stirred. Precipitates were remained and a solvent was removed for removal of a low molecular weight component. Low molecular weight component removal step was further repeated 2 times. Ethyl acetate was introduced to dissolve the precipitates therein so that the whole content became 200 g, thereby obtaining an acrylic copolymer C.

3 Parts of an isocyanate crosslinking agent was blended with 100 parts of the acrylic copolymer C (in terms of a solid content) to obtain a contamination-preventive pressure-sensitive adhesive. The acrylic pressure-sensitive adhesive was applied to a release liner, followed by drying, thereby forming a contamination-preventive pressure-sensitive adhesive layer. This layer on the release liner was transferred on the heat-expandable layer.

EXAMPLE 4

The same type of the heat-expandable layer having a thickness of 40 μm as used in Example 1 was formed on one side of a PET film having a thickness of 50 μm. A contamination-preventive pressure-sensitive adhesive layer having a thickness of 5 μm was formed on the heat-expandable layer to obtain a heat-peelable pressure-sensitive adhesive sheet.

The contamination-preventive pressure-sensitive adhesive layer was formed and used as follows.

100 Parts of butyl acrylate, 2 parts of ethylhexyl acrylate, 5 parts of acrylic acid, 1 part of methacryloyloxyethylene isocyanate, 0.1 part of 2,2'-azoisobutyronitrile and 200 parts of ethyl acetate were blended so as to obtain 200 g of a mixture thereof. The resulting mixture was introduced in a 500 ml three-necked flask-type reactor equipped with a thermometer, stirrer, a nitrogen inlet pipe and a reflux cooling pipe, and stirred for about 1 hour while introducing nitrogen gas thereinto, thereby replacing air inside the reactor with nitrogen. The inner temperature was elevated to 58° C., and polymerization was conducted for about 5 hours while maintaining this state, thereby obtaining acrylic copolymer D.

100 Parts of urethane acrylate, 3 parts of an isocyanate crosslinking agent and 3 parts of a photopolymerization initiator were blended with 100 parts of the acrylic copolymer D (in terms of a solid content) to obtain an acrylic pressure-sensitive adhesive. The acrylic pressure-sensitive adhesive was applied to a release liner, followed by drying, thereby forming a contamination-preventive pressure-sensitive adhesive layer. This layer on the release liner was transferred on the heat-expandable layer.

COMPARATIVE EXAMPLE 1

A heat-peelable pressure-sensitive adhesive sheet was prepared in the same manner as in Example 1 except that a pressure-sensitive adhesive layer was not formed on the heat-expandable layer.

COMPARATIVE EXAMPLE 2

70 Parts of n-butyl acrylate, 30 parts of n-ethyl acrylate, 5 parts of acrylic acid, 0.1 part of 2,2'-azoisobutyronitrile and 200 parts of toluene were blended so as to obtain 200 g of a mixture thereof. The resulting mixture was introduced in a 500 ml three-necked flask-type reactor equipped with a thermometer, a stirrer, a nitrogen inlet pipe and a reflux cooling pipe, and stirred for about 1 hour while introducing nitrogen gas thereinto, thereby replacing air inside the reactor with nitrogen. The inner temperature was elevated to 60° C., and polymerization was conducted for about 6 hours while maintaining this state, followed by aging at 70° C. for 2 hours in order to completely react monomers, thereby obtaining acrylic copolymer C.

2 Parts of an isocyanate crosslinking agent and 35 parts of heat-expandable microspheres (MICROSPHERE F-50D) were blended with a toluene solution containing 100 parts of the acrylic copolymer D obtained above. The resulting mixture was applied on one side of a PET film having a thickness of 50 μm and dried to form a heat-expandable layer having a thickness of 40 μm thereon. Thus, a heat-peelable pressure-sensitive adhesive sheet was obtained.

COMPARATIVE EXAMPLE 3

A heat-peelable pressure-sensitive adhesive sheet was prepared in the same manner as in Example 1 except that a pressure-sensitive adhesive was formed by using the acrylic pressure-sensitive adhesive A alone without any heat-expandable microspheres blended therewith and a pressure-sensitive adhesive layer was not formed thereon.

Evaluation Test

Adhesive Force:

A sample (width: 20 mm) of each of the heat-peelable pressure-sensitive adhesive sheets obtained in the Examples and the Comparative Examples was adhered to a polyester film having a thickness of 25 μm (LUMILAR S-10; manufactured by Toray) and the 180° peel adhesive force (peeling speed: 300 mm/min, 23° C.) was examined. The samples of Examples 1 and 3 and Comparative Examples 1, 2 and 3 were measured before heating and after heating in a hot air dryer at 130° C. for 3 minutes. The samples of Examples 2 and 4 were measured before radiation irradiation and also before heating, after radiation irradiation with an air-cooled high-pressure mercury lamp (46 mJ/min) for 10 seconds (hereinafter the same) and also before heating, before radiation irradiation and also after heating in a hot air dryer at 100° C. for 3 minutes (hereinafter the same), and after radiation irradiation and also after heating.

Evaluation of ΔC and C/Si:

Each of heat-peelable pressure-sensitive adhesive sheets obtained in the Examples and the Comparative Examples was adhered to a mirror-polished 4 inches silicon wafer. After allowing to stand for 1 hour, the sheet was peeled from the silicon wafer according to the above adhesive force measurement test. Surface carbon element proportion C1 (%) on the peeled surface of the silicon wafer was measured with ESCA device, and surface silicon element proportion Si (%) at that time was simultaneously measured.

For the sake of comparison, surface carbon element proportion C2 (%) of the original mirror-polished 4 inches silicon wafer was measured with ESCA device.

ΔC and C/Si were calculated by the following equations.

ΔC=Surface carbon element proportion C1 (%)−Surface carbon element proportion C2 (%)

C/Si=Surface carbon element proportion C1 (%)/Surface silicon element proportion Si (%)

ESCA (XPS) Device:

Manufactured by ULVAC-PHI, INC., 5400

X ray source: MgKα 15 kV (300 W)

Stage tilt: 45°

Measurement area: 1×3.5 mm

Evaluation of Molecular Weight:

Each of heat-peelable pressure-sensitive adhesive sheets obtained in Examples 1 and 3 and Comparative Examples 1 to 3 was heat treated in a hot air dryer at 130° C. for 3 minutes. Surface of each sheet thus treated was rinsed with THF solvent, and molecular weight was measured with GPC device.

Each of radiation-curing and heat-peelable pressure-sensitive adhesive sheets obtained in the Examples 2 and 4 was radiation irradiated with an air-cooling high pressure mercury lamp (46 mJ/min) for 10 seconds, and then heat-treated in a hot air dryer at 130° C. for 3 minutes. Adhesive surface of each sheet was rinsed with THF solvent, and molecular weight of a polymer was measured with GPC device.

The molecular weight measured with GPC is a weight average molecular weight.

Analytical device: HLC-8120 GPC, manufactured by TOHO Co.

Column: TSK gel Super HM-H/H4000/H3000/H2000

The results obtained are shown below.

| | Evaluation Results | | | | | |
|---|---|---|---|---|---|---|
| | Adhesive force (gf/20 mm) | | ΔC | | C/Si | |
| | Before heating | After heating | Before heating | After heating | Before heating | After heating |
| Example 1 | 300 | 2 | 15.0 | 25.0 | 0.68 | 2.22 |
| Example 2 | | | | | | |
| Before radiation irradiation | 150 | 90 | 13.0 | | 1.10 | |
| After radiation irradiation | 30 | 0 | | 12.0 | | 1.50 |
| Example 3 | 450 | 0 | 4.2 | 19.0 | 0.34 | 1.10 |
| Example 4 | | | | | | |
| Before radiation irradiation | 600 | 50 | 10.2 | | 0.91 | |
| After radiation irradiation | 80 | 0 | | 1.2 | | 0.29 |
| Comparative Example 1 | 350 | 0 | 11.8 | 90.0 | 2.50 | 5.20 |
| Comparative Example 2 | 280 | 0 | 14.0 | 72.0 | 1.60 | 4.80 |
| Comparative Example 3 | 310 | 420 | 30.0 | 55.0 | 0.56 | 3.00 |

| Molecular Weight | |
|---|---|
| | Content of component having molecular weight of 100,000 or less (%) |
| Example 1 | 10 |
| Example 2 | 5 |
| Example 3 | 2 |
| Example 4 | 0.5 |
| Comparative Example 1 | 25 |
| Comparative Example 2 | 23 |
| Comparative Example 3 | 20 |

What is claimed is:

1. A heat-peelable pressure-sensitive adhesive sheet comprising a substrate, a heat-expandable layer which contains heat-expandable microspheres and expands upon heating, formed on at least one side of the substrate, and a non-heat-expandable pressure-sensitive adhesive layer comprising a pressure-sensitive adhesive formed on the heat-expandable layer, wherein when the heat-peelable pressure-sensitive sheet is adhered to a semiconductor silicon wafer and then peeled from the wafer by heating, an amount of organic contamination on the surface of the semiconductor silicon wafer Δc is 50 or less, wherein the pressure-sensitive adhesive in the non-heat-expandable pressure-sensitive adhesive layer comprises a polymer, containing (i) a low molecular weight component having a molecular weight of 100,000 or less in an amount of 15% by weight or less, based on the weight of the polymer, and (ii) a component having a molecular weight of greater than 100,000, wherein the polymer has a conversion of 80.5% to 97% after polymerization, and wherein the non-heat-expandable pressure-sensitive adhesive layer has a thickness of 20 μm or less.

2. A heat-peelable pressure-sensitive adhesive sheet as claimed in claimed 1, which has a pressure-sensitive adhesive formed on the surface of the substrate opposite the surface thereof on which the heat-expandable layer is formed.

3. A method of producing electronic parts, comprising a step of adhering the heat-peelable pressure-sensitive adhesive sheet as claimed in claim 1 to electronic parts to protect the electronic parts when processing the same, or to conduct dicing processing or fine processing.

4. Electronic parts obtained by the method as claimed in claim 3.

5. A heat-peelable pressure-sensitive adhesive sheet comprising a substrate, a heat-expandable layer which contains heat-expandable microspheres and expands upon heating, formed on at least one side of the substrate, and a non-heat-expandable pressure-sensitive adhesive layer comprising a pressure-sensitive adhesive formed on the heat-expandable layer, wherein when the heat-peelable pressure-sensitive sheet is adhered to a semiconductor silicon wafer and then peeled from the wafer by heating, amount of organic contamination on the surface of the semiconductor silicon wafer C/Si is 2.5 or less, wherein the pressure-sensitive adhesive in the non-heat-expandable pressure-sensitive adhesive layer comprises a polymer containing (i) a low molecular weight component having a molecular weight of 100,000 or less in an amount of 15% by weight or less, based on the weight of the polymer, and (ii) a component having a molecular weight of greater than 100,000, wherein the polymer has a conversion of 80.5% to 97% after polymerization, and wherein the non-heat-expandable pressure-sensitive adhesive layer has a thickness of 20 $\mu$m or less.

6. The heat-peelable pressure-sensitive adhesive sheet as claimed in claim 5, which has a pressure-sensitive adhesive formed on the surface of the substrate opposite the surface thereof on which the heat-expandable layer is formed.

7. A method of producing electronic parts, comprising a step of adhering the heat-peelable pressure-sensitive adhesive sheet as claimed in claim 5 to electronic parts to protect the electronic parts when processing the same, or to conduct dicing processing or fine processing.

8. Electronic parts obtained by the method as claimed in claim 7.

9. A heat-peelable pressure-sensitive adhesive sheet comprising a substrate, a heat-expandable layer which contains heat-expandable microspheres and expands upon heating, formed on at least one side of the substrate, and a non-heat-expandable pressure-sensitive adhesive layer comprising a pressure-sensitive adhesive formed on the heat-expandable layer, wherein the heat-expandable layer exhibits adhesive properties and is supported by the substrate, the pressure-sensitive adhesive of the non-heat-expandable pressure-sensitive adhesive layer is a contamination-preventive and radiation-curing pressure-sensitive adhesive, and when the heat-peelable pressure-sensitive sheet is adhered to a semiconductor silicon wafer and then peeled from the wafer by heating, an amount of organic contamination on the surface of the semiconductor silicon wafer $\Delta$c is 50 or less, wherein the contamination-preventive and radiation-curing pressure-sensitive adhesive in the non-heat-expandable-pressure-sensitive adhesive layer after radiation irradiation comprises a polymer, containing (i) a low molecular weight component having a molecular weight of 100,000 or less in an amount of 15% by weight or less, based on the weight of the polymer, and (ii) a component having a molecular weight of greater than 100,000, wherein the polymer has a conversion of 80.5% to 97% after polymerization, and wherein the non-heat-expandable pressure-sensitive adhesive layer has a thickness of 20 $\mu$m or less.

10. A heat-peelable pressure-sensitive adhesive sheet comprising a substrate, a heat-expandable layer which contains heat-expandable microspheres and expands upon heating, formed on at least one side of the substrate, and a non-heat-expandable pressure-sensitive adhesive layer comprising a pressure-sensitive adhesive formed on the heat-expandable layer, wherein the heat-expandable layer exhibits adhesive properties and is supported by the substrate, the pressure-sensitive adhesive of the non-heat-expandable pressure-sensitive adhesive layer is a contamination-preventive and radiation-curing pressure-sensitive adhesive, and when the heat-peelable pressure-sensitive sheet is adhered to a semiconductor silicon wafer and then peeled from the wafer by heating, amount of organic contamination on the surface of the semiconductor silicon wafer C/Si is 2.5 or less, wherein the contamination-preventive and radiation-curing pressure-sensitive adhesive in the non-heat-expandable pressure-sensitive adhesive layer after radiation irradiation comprises a polymer containing (i) a low molecular weight component having a molecular weight of 100,000 or less in an amount of 15% by weight or less, based on the weight of the polymer, and (ii) a component having a molecular weight of greater than 100,000, wherein the polymer has a conversion of 80.5% to 97% after polymerization, and wherein the non-heat-expandable pressure-sensitive adhesive layer has a thickness of 20 $\mu$m or less.

* * * * *